United States Patent
Wang

(10) Patent No.: US 11,265,499 B2
(45) Date of Patent: Mar. 1, 2022

(54) REDUCTION OF FIXED-PATTERN NOISE IN DIGITAL IMAGE SENSORS BY MITIGATING GAIN MISMATCH ERROR

(71) Applicant: Shenzhen Goodix Technology Co., Ltd., Shenzhen (CN)

(72) Inventor: Xiaodong Wang, Shenzhen (CN)

(73) Assignee: Shenzhen Goodix Technology Co., Ltd., Shenzhen (CN)

( * ) Notice: Subject to any disclaimer, the term of this patent is extended or adjusted under 35 U.S.C. 154(b) by 252 days.

(21) Appl. No.: 16/808,396

(22) Filed: Mar. 4, 2020

(65) Prior Publication Data

US 2021/0281792 A1   Sep. 9, 2021

(51) Int. Cl.
   *H04N 5/3745*   (2011.01)
   *H01L 27/146*   (2006.01)

(52) U.S. Cl.
   CPC ... *H04N 5/37455* (2013.01); *H01L 27/14605* (2013.01); *H01L 27/14643* (2013.01)

(58) Field of Classification Search
   CPC .. H04N 5/37455; H04N 5/3658; H04N 5/378; H01L 27/14605; H01L 27/14643
   See application file for complete search history.

(56) References Cited

U.S. PATENT DOCUMENTS

| | | |
|---|---|---|
| 2009/0322577 A1 | 12/2009 | Johansson |
| 2018/0098015 A1 | 4/2018 | Lee et al. |
| 2021/0218919 A1* | 7/2021 | Wang ................. H04N 5/37455 |

FOREIGN PATENT DOCUMENTS

| | | |
|---|---|---|
| CN | 103686008 A | 3/2014 |
| CN | 106470322 A | 3/2017 |
| CN | 107872629 A | 4/2018 |
| JP | 2005167519 A | 6/2005 |

* cited by examiner

*Primary Examiner* — Lin Ye
*Assistant Examiner* — John H Morehead, III
(74) *Attorney, Agent, or Firm* — Kilpatrick Townsend & Stockton LLP

(57) ABSTRACT

Techniques are described for error-modulated pixel readout by column-parallel programmable gain amplifiers (PGAs) in a digital image sensor. Each PGA has an amplifier with gain set by a ratio of input and feedback capacitors. Mismatch between these capacitors can manifest as vertical fixed pattern noise (FPN) in the image output. Embodiments use a swap control signal to pseudo-randomly toggle between two or more swap states for each of a sequence of row scan times. Each swap state at least directs coupling of a particular capacitor network in either the input or the feedback path of the amplifier. Pseudo-randomly swapping those couplings of the capacitive networks also pseudo-randomly modulates gain error from capacitive mismatch between the capacitor networks. The FPN effectively becomes spatially modulated noise at a level far below what would be considered as a visible artifact in the image output.

20 Claims, 9 Drawing Sheets

REDUCTION OF FIXED-PATTERN NOISE IN DIGITAL IMAGE SENSORS BY MITIGATING GAIN MISMATCH ERROR

FIELD

The invention relates generally to digital image sensors. More particularly, embodiments relate to reducing fixed-pattern noise in complementary metal-oxide semiconductor (CMOS) digital image sensors by mitigating gain mismatch error in column-parallel analog-to-digital converters (ADCs).

BACKGROUND

Many electronic devices include cameras and other features that rely on digital image sensors. For example, most modern smartphones include one or more digital cameras that rely on digital image sensing hardware and software to capture and process images. Such applications often perform image sensing using a complementary metal-oxide semiconductor (CMOS) image sensor (CIS). Over time, consumers have desired increased performance from these image sensors, including higher resolution and lower noise. Further, particularly in portable electronic devices (e.g., with fixed battery capacity), it has been desirable to provide such features without adversely impacting power consumption and dynamic range. For example, analog power drives a significant, if not dominant, part of the power consumption of a modern CIS. As such, implementing a high-performance CIS in a portable electronic device can involve designing analog-to-digital converters (ADCs) and other components within strict power efficiency and noise constraints.

BRIEF SUMMARY OF THE INVENTION

Embodiments provide error-modulated pixel readout by column-parallel programmable gain amplifiers (PGAs) in a digital image sensor. Each PGA has an amplifier with gain set by a ratio of input and feedback capacitors. Mismatch between these capacitors can manifest as vertical fixed pattern noise (FPN) in the image output. Embodiments use a swap control signal to pseudo-randomly toggle between two or more swap states for each of a sequence of row scan times. Each swap state at least directs coupling of a particular capacitor network in either the input or the feedback path of the amplifier. Pseudo-randomly swapping those couplings of the capacitive networks also pseudo-randomly modulates gain error from capacitive mismatch between the capacitor networks. The FPN effectively becomes spatially modulated noise at a level far below what would be considered as a visible artifact in the image output.

For example, in each row scan time, each PGA receives a swap control signal indicating a swap state generated according to a pseudo-random sequence. The PGA can then receive a respective pixel signal from the digital image sensor. The PGA can also configure its respective operational amplifier according to the swap state. For example, two matched capacitor networks can have capacitances of $C1$ and $C2$, respectively. Though nominally of the same value, process variation and/or other factors results in $C1$ being equal to $C2+\delta$, where $\delta$ represents a small mismatch error (accordingly, $C2=C1-\delta$). In an illustrative first swap state, $C1$ is coupled as the input capacitance, and $C2$ is coupled as the feedback capacitance. The resulting gain is based on the ratio $C1/C2$, such that the gain is approximately $(C2+\delta)/C2$, or $1+(\delta/C2)$. Assuming a very small $\delta$, this represents a unity gain with a first small mismatch error. Though the error is small, it manifests as a visible artifact (as FPN) when repeated consistently over a column of pixel outputs from a digital image sensor. In a corresponding illustrative second swap state, $C2$ is coupled as the input capacitance, and $C1$ is coupled as the feedback capacitance. The resulting gain is based on the ratio $C2/C1$, such that the gain is approximately $(C1-\delta)/C1$, or $1-(\delta/C1)$. Again, assuming a very small $\delta$, the gain is still a unity gain, but with a second (different) small mismatch error. Pseudo-randomly toggling between these two swap states pseudo-randomly modulates the gain error between the two mismatch errors over the scan readout. The errors effectively become spatially modulated noise at a level far below what would typically be considered as a visible artifact.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Many electronic devices include cameras and other features that rely on digital image sensors. For example, most modern smartphones include one or more digital cameras that rely on digital image sensing hardware and software to capture and process images. Such applications often perform image sensing using a complementary metal-oxide semiconductor (CMOS) image sensor (CIS).

Figure 1:
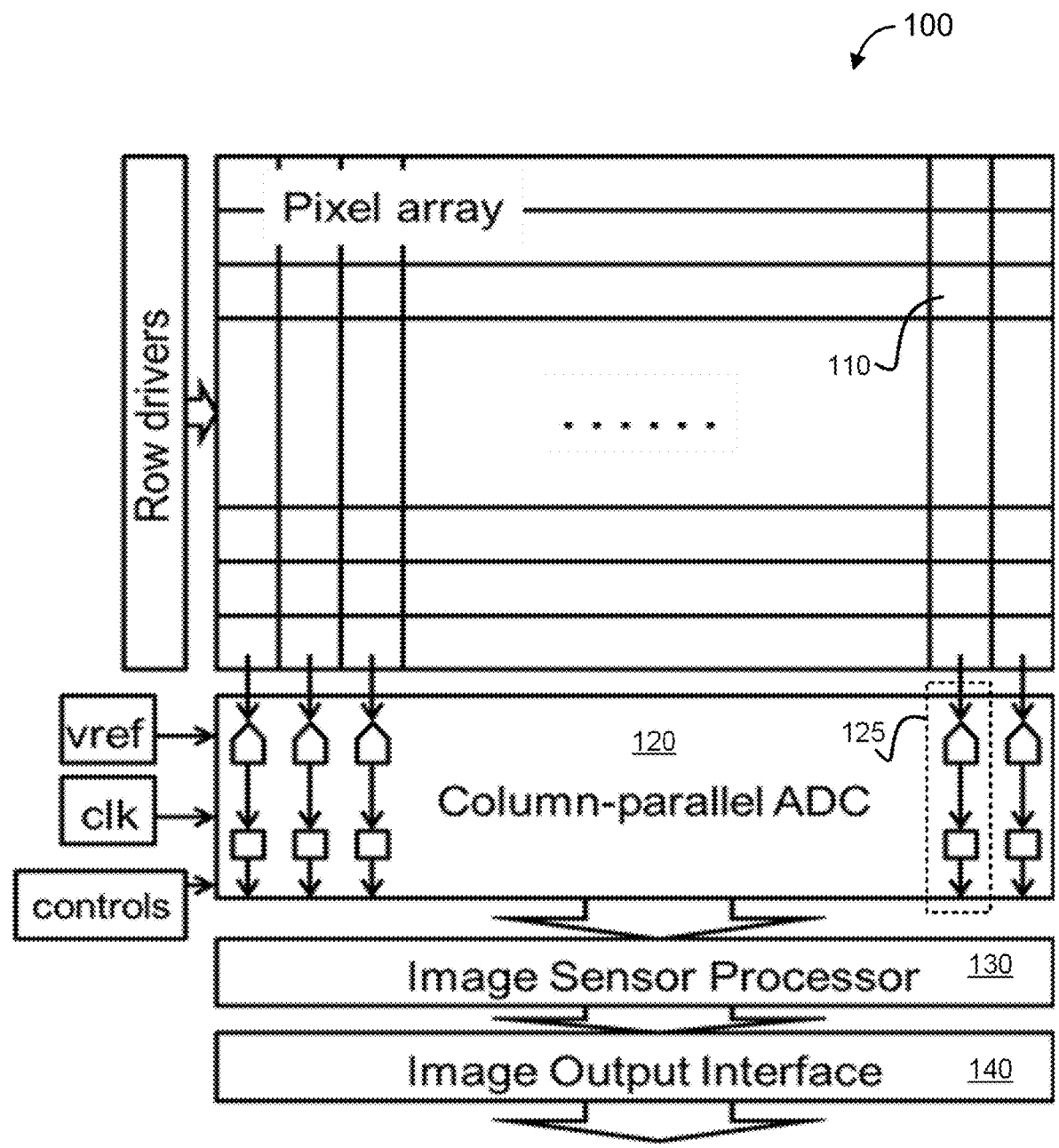
FIG. 1 shows an illustrative complementary metal-oxide semiconductor (CMOS) image sensor (CIS), as a context for various embodiments described herein.

FIG. 1 shows an illustrative complementary metal-oxide semiconductor (CMOS) image sensor (CIS) 100, as a context for various embodiments described herein. As illustrated, the CIS incudes a large number of photodetectors arranged as an array of pixels 110. The pixels are read row-by-row by a read block 120 made up of a set of column-parallel analog-to-digital converters (ADCs) 125. For example, optical information is captured by the array of pixels 110. To read out the data from the pixels 110, the rows are sequentially shifted, one at a time, to the read block 120. As each row reaches the read block 120 in turn, all the columns of the row are read in parallel by the ADCs 125. These operations are assisted by additional components, such as row drivers, column control circuitry, and various references signaling (e.g., to generate one or more reference voltages, reference clocks, etc.). Data from the column-parallel ADCs 125 can be processed by an image sensor processor 130, and output by an image output interface 140 (e.g., for use by downstream hardware and/or software components).

Over time, consumers have desired increased performance from these image sensors, including higher resolution (e.g., larger arrays with larger numbers of pixels 110) and lower noise. For example, some modern CISs include arrays with over 100 million pixels. Further, particularly in portable electronic devices (e.g., with fixed battery capacity), it has been desirable to provide such features without adversely impacting power consumption and dynamic range. For example, analog power drives a significant, if not dominant, part of the power consumption of a modern CIS, and consumers can be sensitive to features that reduce battery life. As such, implementing a high-performance CIS in a portable electronic device can involve designing analog-to-digital converters (ADCs) and other components within strict power efficiency and noise constraints. Some conventional implementations achieve desirable levels of power and noise, with desirable amounts of dynamic range, by using programmable gain amplifiers (PGAs) to adjust gain at a pixel level.

Figure 2:
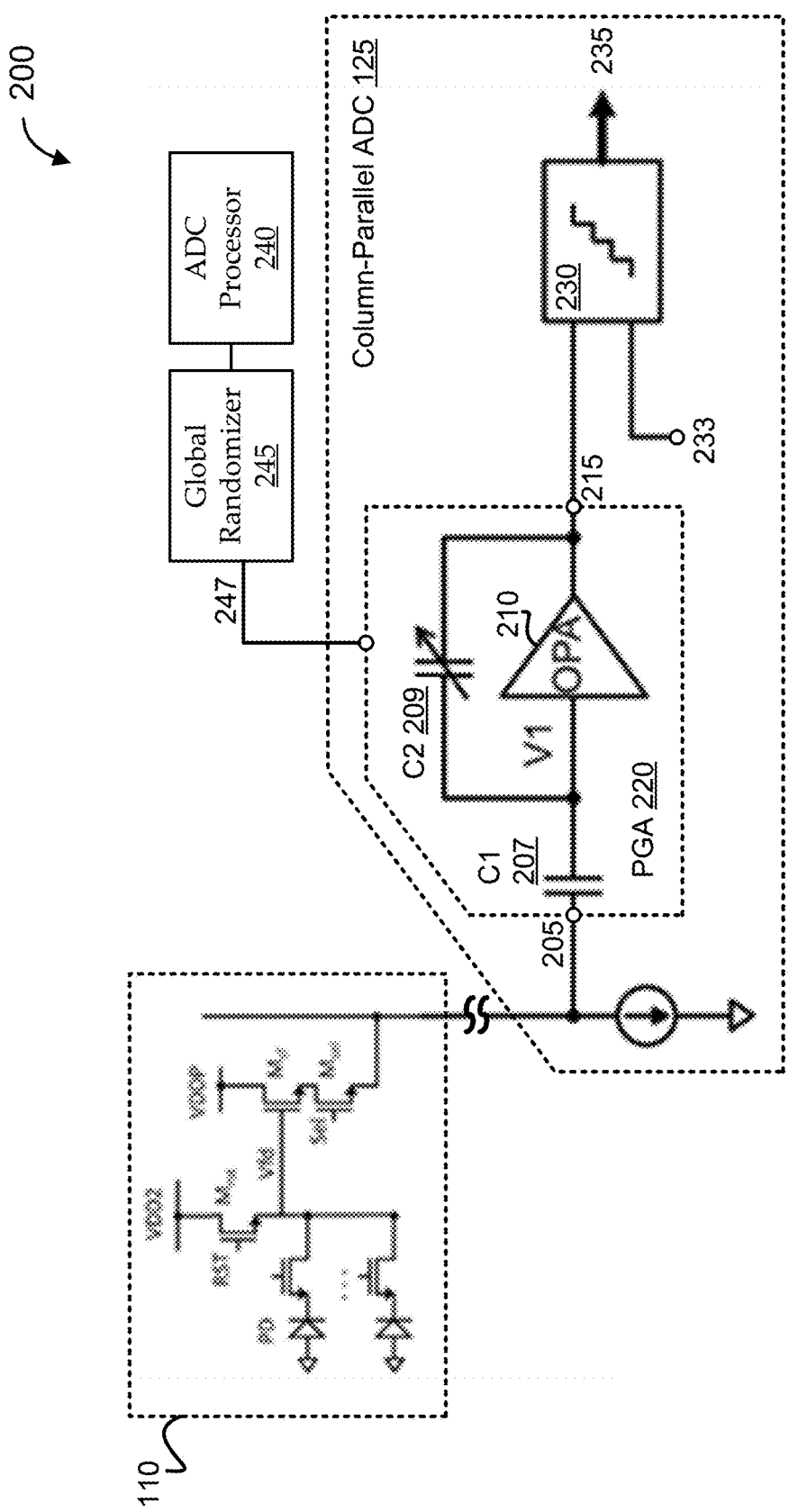
FIG. 2 shows a circuit block diagram an illustrative pixel coupled with a simplified illustrative column-parallel analog-to-digital converter (ADC), according to various embodiments.

FIG. 2 shows a circuit block diagram 200 an illustrative pixel 110 coupled with a simplified illustrative column-parallel analog-to-digital converter (ADC) 125, according to various embodiments. The illustrative pixel 110 circuit generally shows a set of photodiodes arranged to capture and store optical information, for example, indicating an amount of light detected at that pixel 110. The pixel 110 can be an implementation of one of the pixels 110 in one of the columns of an array of a CIS, such as shown in FIG. 1. The illustrated ADC 125 can be an implementation of one of the column-parallel ADCs 125 of the CIS, particularly the ADC 125 coupled with the column including the pixel 110.

In general, it can be desirable for CIS products to have low readout noise to improve image quality, especially in low light conditions (i.e., at low pixel signal levels). At the same time, it can be desirable to maintain low power consumption, even as CIS pixel resolutions are increasing. For example, in mobile electronics applications, such as smart phones, battery power consumption can be an important design constraint. Adding a gain block before the conversion block (e.g., column gain before column ADC) can be an effective way to achieve low pixel readout noise when the signal level is low. As illustrated in FIG. 2, what is referred to as the "column-parallel ADC 125" is actually a gain block followed by a conversion block 230. The conversion block 230 can include an ADC circuit and/or any other suitable components.

The gain block is implemented as a programmable gain amplifier (PGA) 220, such as a capacitor-based PGA 220. In such a PGA 220, the gain is set by a ratio of an input capacitor network (C1 207) and a feedback capacitor network (C2 209); the gain of the PGA can be generally described as C1/C2. The PGA 220 can be used to apply different amounts of gain for different pixel signal levels. For example, when the pixel signal level is low, the noise at subsequent blocks (e.g., an ADC comparator block, reference block, counter block, etc.; none of which are shown to avoid over-complicating the figure) are all attenuated referred to pixel readout. Even though the PGA 220 can add noise, a balanced design (e.g., using a single-ended operational amplifier, as illustrated by operational amplifier 210) will tend to achieve a lower overall noise in the readout path without increasing power. The PGA gain is reduced at high illumination conditions to avoid the conversion block 230 becoming overloaded. As such, the PGA 220 can be used to apply a low-level gain to the high-level pixel signal. In some typical implementations, this low-level gain can be a "1x" (unity) gain. Such a unity-gain configuration can be achieved by setting C1 and C2 to be equal.

As described above, each row of pixels 110 is sequentially shifted to the column-parallel ADCs 125 for readout. Accordingly, after each sequential shifting, each ADC 125 is provided with a pixel signal 205 corresponding to the output from a particular pixel 110 after having been shifted down its column until reaching the column-parallel ADC 125. As illustrated, the pixel signal 205 is received at an input of the PGA 220. The PGA 220 includes an operational amplifier 210 having the input capacitor network 207 (shown as a single fixed capacitor, C1) at its input, and having the feedback capacitor network 209 (shown as a single variable capacitor, C2) coupled between its output and its input to form a feedback path. In such a configuration, the total gain of the amplifier corresponds to the ratio of C1 to C2 (C1/C2, or −C1/C2, depending on the implementation). Thus, a PGA output signal 215 seen at the output of the PGA 220 corresponds to the pixel signal 205 amplified by the PGA 220 in accordance with the gain applied by the PGA 220.

Different embodiments of the column-parallel ADCs 125 can operate in different ways. In some embodiments, when each row of pixels 110 is read by the column-parallel ADCs 125, the readout by each ADC 125 can include one or more phases, such as a reset (or "auto-zeroing") phase and a signal (or "transmit," or "TX/signal") phase. During the readout phases, a pre-decision can be made to determine an appropriate gain setting for the PGA 220. The gain of the PGA 220 can be set according to the determined gain setting (e.g., the gain of feedback capacitor network 209 can be adjusted), and the gain can be applied to the pixel signal 205 to generate a PGA output signal 215. The PGA output signal 215 can be passed to a conversion block 230. The conversion block 230 uses the PGA output signal 215 and a reference voltage 233 (or any other suitable input signal(s)) to generate a digital pixel output 235 corresponding to the pixel signal 205.

As illustrated, the ADC 125 can include, or be in communication with, an ADC processor 240 to direct implementation of various features. Though the ADC processor 240 is illustrated as separate from the single ADC 125, embodiments of the ADC processor 240 can be part of, or shared among multiple, or even all, of the ADCs 125 of the CIS. For example, a single ADC processor 240 is part of the CIS, and all ADCs 125 share resources of the ADC processor 240. In some implementations, each ADC 125 has its own ADC processor 240 implemented as dedicated processor resources for that ADC 125. In other implementations, each ADC 125 has certain dedicated processor resources, and the CIS has global processor resources for shared use by some or all of the ADCs 125, and the total of all those processor resources are considered to constitute the ADC processor 240. The ADC processor 240 can include any suitable processor, such as a central processing unit (CPU), an application-specific integrated circuit (ASIC), an application-specific instruction-set processor (ASIP), a graphics processing unit (GPU), a physics processing unit (PPU), a digital signal processor (DSP), a field-programmable gate array (FPGA), a programmable logic device (PLD), a controller, a microcontroller unit, a reduced instruction set (RISC) processor, a complex instruction set processor (CISC), a microprocessor, or the like, or any combination thereof, or any portion thereof. The ADC processor 240 can control some or all components of the ADC 125. For example, the ADC processor 240 can control operations of the PGA 220 by controlling the gain setting to be used by the PGA 220 (e.g., directly, by controlling one or more other signals, by responding to one or more other signals, etc.).

Embodiments of the ADC processor 240 can include, or can be in communication with, a global randomizer 245. The global randomizer 245 can include any suitable hardware and/or software for generating a random value to support functionality described herein. As used herein, the term "random" (or related terms, like "randomized") are intended to generally describe any sequence having sufficient variability to provide the desired effect. In some implementations, the effect is provided by using noise, or other techniques to generate a sequence of pseudo-random bit values. In other implementations, highly irregular sequences of bits can be used from any suitable source. The global randomizer 245 can generate one or more randomized swap control signals 247 for communication to the ADCs. The swap control signals 247 direct the ADCs 125 to effectively swap input and feedback capacitor networks in a substantially random manner. In some implementations, the same swap control signal 247 is communicated in parallel to all the ADCs 125 and changes (e.g., is directed to change by the ADC processor 240) for the column-parallel readout of each row of pixels. In other implementations, the swap control signals 247 can be different across some or all of the columns, for example, by sending different signals in parallel to different ones of the ADCs 125. In other implementations, swap control signals 247 can be used to introduce randomization in any suitable manner.

As described above, the gain of the PGA 220 is effectively set by the ratio of C1 207 to C2 209, and a unity gain can be achieved by setting C1 207 to be equal to C2 209. In practice, C1 207 and C2 209 can never be precisely equal, as they are implemented using separate components; even nominally identical components can differ because of process variations and/or other reasons. This can be referred to as capacitor mismatch. The capacitor mismatch can manifest as a gain error, which is effectively a deviation from unity gain. Because the PGAs 220 are part of column-parallel ADCs 125, any particular PGA 220 is typically associated with a particular column, such that a particular PGA 220 is used to read out all the rows of pixels for that particular column. In such a configuration, the same gain (and thus the same gain error) is applied to each entire column of pixels in accordance with the particular mismatch between the capacitors of its column-parallel ADC 125. The column gain mismatch error thus translates to a substantially fixed noise manifesting as a vertical stripe pattern, known as "vertical fixed pattern noise," or "column fixed pattern noise." This noise is referred to herein simply as "fixed pattern noise," or "FPN."

Figure 3A:
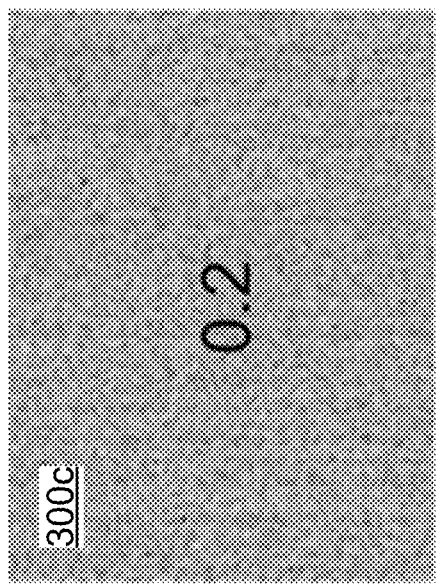
FIGS. 3A-3D show a series of illustrative CIS output frames with different amounts of vertical fixed-pattern noise (FPN).
Figure 3B:
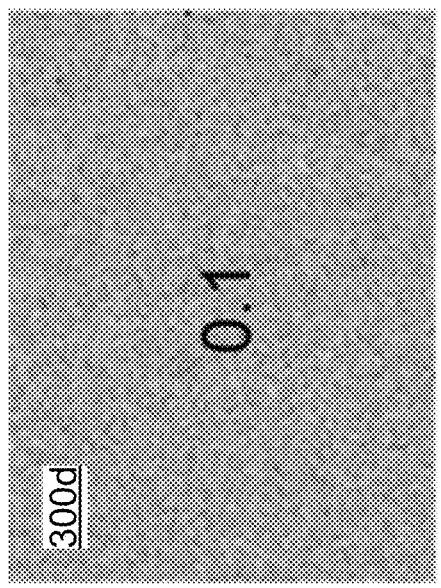
Figure 3C:
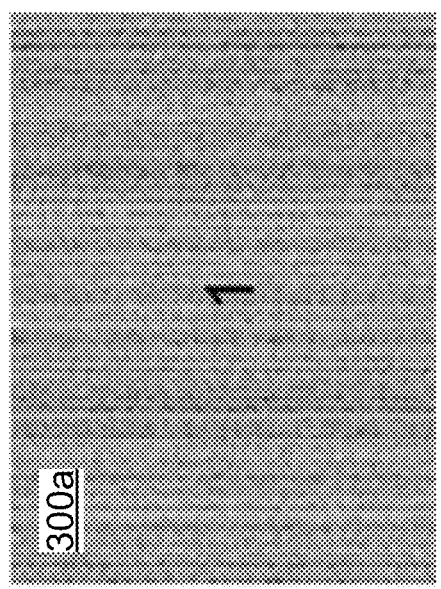
Figure 3D:
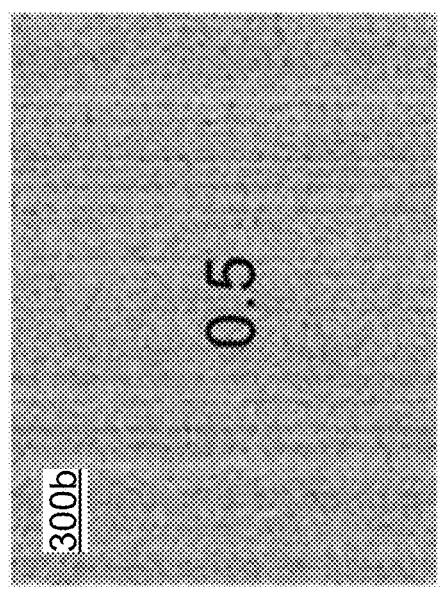

Even when the gain mismatch is small, its consistent application across the entire column tends to make it more visually noticeable. FIGS. 3A-3D show a series of illustrative CIS output frames 300 with different amounts of vertical fixed-pattern noise (FPN). The frames 300 show cases in which the FPN in each column is N-times the magnitude of a random noise term in the same column, where N is 1, 0.5, 0.2, and 0.1, respectively (e.g., illustrated by frames 300a-300d of FIGS. 3A-3D, respectively). For example, the first frame 300a of FIG. 3A shows a scenario in which the FPN in each column is equal to (1×) the magnitude of a random noise term in the same column. It can be seen that such FPN is visible until it falls to a magnitude on the order of ten percent or less (0.1×) of a random noise term in the same column, as illustrated by frame 300d of FIG. 3D. Accordingly, FPN of greater than such a magnitude creates visible artifacts in the output of the CIS.

Figure 4:
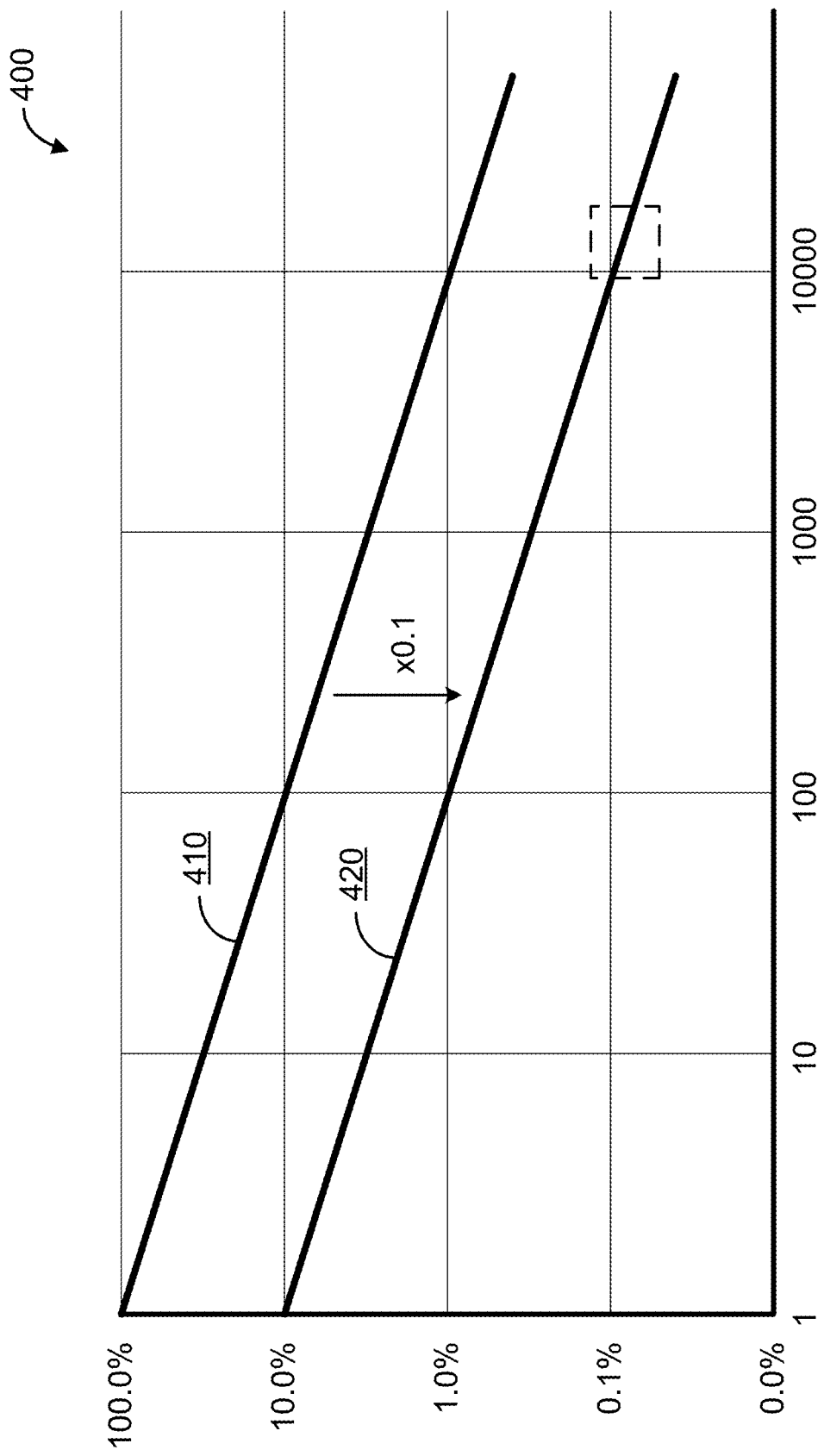
FIG. 4 shows a plot of column gain deviation versus pixel signal level.

Further, column gain deviation can depend on the pixel signal level. To illustrate this, FIG. 4 shows a plot 400 of column gain deviation versus pixel signal level. The pixel signal in a CIS is generated by electrons collected in the pixel photodiode over an exposure time, such that the pixel signal level can be measured in number of electrons (NE). The x-axis of the plot 400 shows a range of pixel signal levels measured in NE. A first curve 410 shows inherent shot noise of the electron signal as a percentage of the signal level. As shown, the collected electron signal has an inherent shot noise that varies with the number of electrons (NE). A relative random error can be described as sqrt(NE)/NE, which equals 1/sqrt(NE). A second curve 420 shows a column gain deviation tolerance. To be visually insignificant, designs can seek a signal-dependent column gain deviation of less than 0.1/sqrt(NE). Thus, as shown, the column gain deviation can be approximately ten percent of the shot noise at each signal level, as shown. It can be seen from plot 420 that, as the signal level increases, the column gain deviation tolerance decreases. At signal levels around 10,000 electrons, obtaining a desired column gain deviation can involve achieving tolerances of approximately 0.1*1/sqrt(10,000) (illustrated by the dashed square).

Some conventional approaches seek careful matching of the capacitors in the PGA (i.e., reducing capacitor mismatch), including using precision MOM (Metal-Oxide-Metal) or MIM (Metal-Insulator-Metal) capacitors. However, even with such careful matching, it is generally impractical to achieving the strict levels of tolerance desired at high signal levels. Other conventional approaches seek to calibrate for column gain mismatch by performing a gain calibration at each column readout path to obtain a calibration code, and storing the calibration codes in hardware. The calibration codes can subsequently be used for real-time gain error correction. While such an approach can be effective, it tends to be complicated and to involve undesirable calibration time and test cost. As these conventional approaches tend to address each PGA (e.g., by precision capacitor matching at each PGA, by calibration at each PGA, etc.), the limitations of these conventional approaches tend to scale with the number of column-parallel ADCs in the CIS. In many applications, the CIS supports resolutions of 1 Megapixel or more, such that the CIS can include many thousands of column-parallel ADCs (and, thus, many thousands of PGAs).

Figure 5:
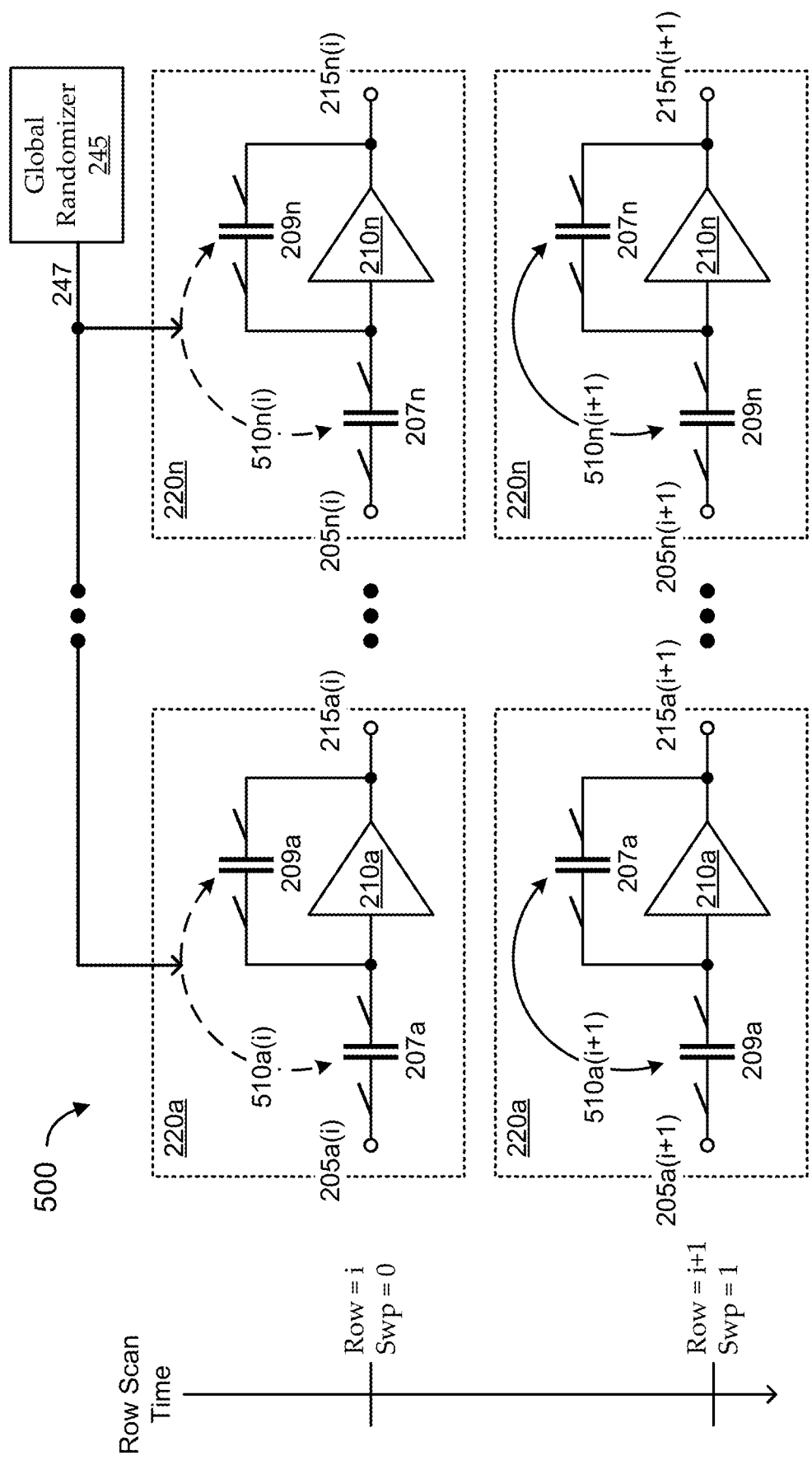
FIG. 5 shows a simplified circuit diagram including multiple programmable gain amplifiers (PGAs) coupled with a global randomizer, according to various embodiments.

Embodiments described herein introduce a randomizing modulation on the PGA gain error by randomly (or pseudo-randomly) swapping the input and feedback capacitor networks in the PGAs. FIG. 5 shows a simplified circuit diagram 500 including multiple PGAs 220 (each of a respective column-parallel ADC 125) coupled with a global randomizer 245, according to various embodiments. The circuit diagram 500 shows N PGAs 220, represented by nominally identical PGA 220a through PGA 220n. As described above, each PGA 220 is part of a respective column-parallel ADC 125, such that each PGA 220 is associated with a respective column of pixels of a CIS. During a row scan routine, each row of pixels of the CIS is sequentially shifted to the column-parallel ADCs 125 for readout. FIG. 5 illustrates two sequential readouts of such a row scan routine. For example, at time i, pixel row(i) is shifted to the column-parallel ADCs 125 for readout, such that each PGA 220 receives a pixel signal 205 from the pixel of row(i) that is in its associated column. At time i+1, pixel row(i+1) is shifted to the column-parallel ADCs 125 for readout, such that each PGA 220 receives a pixel signal 205 from the pixel of row(i+1) that is in its same associated column.

Each PGA 220 can be an implementation of the PGA 220 described with reference to FIG. 2. As illustrated, each PGA 220 includes an operational amplifier 210 coupled with an first capacitor network 207 (having capacitance C1) and a second capacitor network 209 (having capacitance C2). Note that one or both capacitor networks can be implemented as variable capacitor networks to provide variable gain for different pixel signals. Descriptions herein that refer to the capacitance of a particular capacitor network (e.g., C1 or C2) are referring to the capacitance of that capacitor network in a particular gain state. For the sake of simplicity, the gain state is assumed to be a unity gain state, such that C1 and C2 are set to be nominally equal.

Each capacitor network can include any suitable number of capacitors. In one implementation, each capacitor network includes a single capacitor. In some implementations, each capacitor network (e.g., and/or each capacitor in each capacitor network) includes a switch at its input and/or at its output. Providing a switch at both the input and the output sides of the capacitor can improve performance in some implementations, such as by providing improved analog performance. It can be desirable to seek capacitor matching to the extent possible, even though the described invention can mitigate some effects of remaining mismatch. As such, some embodiments implement each capacitor network in a nominally identical fashion. For example, such embodiments implement each capacitor network with the same number of capacitors, same types of capacitors, and same nominal capacitance values; and also with the same number and type of switches. As described herein, even though the capacitor networks may be nominally identical, there tend to be small mismatches between components due to process variation, and other factors.

As illustrated, the global randomizer 245 is coupled with each of the PGAs 220. The global randomizer 245 can be implemented in any suitable manner to generate one or more swap control signals 247 having an effectively random value. In one embodiment, the global randomizer 245 is implemented using a Linear-Feedback Shift Register (LFSR), and the swap control signal 247 is a digital bit sequence. In some implementations, the value of the swap control signal 247 changes for each row readout of a scan routine. The global randomizer 245 is coupled with each PGA 220 in such a way that the swap control signal 247 controls a respective swap state 510 of each PGA 220.

The illustrated implementation shows a single capacitor in each capacitor network. Such an implementation may support two swap states 510 (e.g., "swapped" and "unswapped"). For example, at each row scan time, the swap control signal 247 indicates a '1' or a '0', each corresponding to a respective one of the swap states 510. In the illustrated implementation, the same swap control signal 247 is coupled with all the PGAs 220, so that the swap state 510 is the same across all the PGAs 220 at any particular row scan time. In other implementations, multiple swap control signals 247 can be used for different portions of the PGAs 220. For example, in context of certain routing constraints or opportunities on a circuit board, it can be preferable to couple logical groupings of PGAs 220 with respective swap control signals 247, the swap control signals 247 generated in such cases by one or multiple global randomizers 245.

In the illustrated case, at time i, pixel row(i) is shifted to the column-parallel ADCs 125 for readout, and the swap control signal 247 is indicating a '0' (e.g., "unswapped"). As such, PGAs 220a-220n receive pixel signals 205a(i)-205n(i) from the pixel of row(i), respectively. The swap control signal 247 indicating a '0' can cause the PGAs 220 in time i to be configured as illustrated, with the capacitor network 207 (having capacitance C1) of each PGA 220 coupled with its operational amplifier 210 as an input capacitor network, and the capacitor network 209 (having capacitance C2) of each PGA 220 coupled with its operational amplifier 210 as a feedback capacitor network. The unswapped swap state 510 is illustrated by a dashed curved arrow. In such a configuration, the gain of the each PGA 220 is defined by C1/C2. In any particular PGA 220k, if we assume the capacitance (C1) to equal C2 plus a small error ($\delta$), the gain can be defined as (C2+$\delta$)/C2, or 1+($\delta$/C2). For the sake of simplicity, this can be considered as a gain error modulation of +1.

At time i+1, pixel row(i+1) is shifted to the column-parallel ADCs 125 for readout, and the swap control signal 247 is indicating a '1' (e.g., "swapped"). As such, PGAs 220a-220n receive pixel signals 205a(i+1)-205n(i+1) from the pixel of row(i+1), respectively. The swap control signal 247 indicating a '1' can cause the PGAs 220 in time i+1 to swap capacitor networks. In the swapped condition, each PGA 220 is reconfigured (e.g., by switched or other components, not shown), so that each capacitor network 209 (having capacitance C2) is coupled with its operational amplifier 210 as an input capacitor network, and each capacitor network 207 (having capacitance C1) is coupled with its operational amplifier 210 as a feedback capacitor network. The swapped swap state 510 is illustrated by a solid curved arrow. In such a configuration, the gain of the each PGA 220 is defined by C2/C1, such that the gain can be defined as (C2+$\delta$)/C2. For the sake of simplicity, this can be considered as a gain error modulation of −1.

As described above, a concern with the gain error may not be the error itself, but rather that the error of each column-parallel ADC becomes fixed across its entire associated column, thereby manifesting as vertical FPN. Using the swap control signal 247 to randomly swap the input and feedback capacitor networks in the PGAs 220 also generates random modulation in the gain error over the row scan times of the row scan routine. Rather than digitally correcting gain deviation, the gain deviation term can be transformed from a fixed error in the output of each column-parallel ADC 125 to a spatially variant pseudo-random sequence. The pseudo-random gain error sequence manifests effectively as a low-level random noise in the CIS output, rather than as a column fixed pattern noise. Such a low-level random noise can tend to have an insignificant visual impact. For example, in the example above, over a large number of row scan times, the pseudo-random sequence of gain error modulations (e.g., 1, −1, 1, . . . ) averages to zero.

Figure 6:
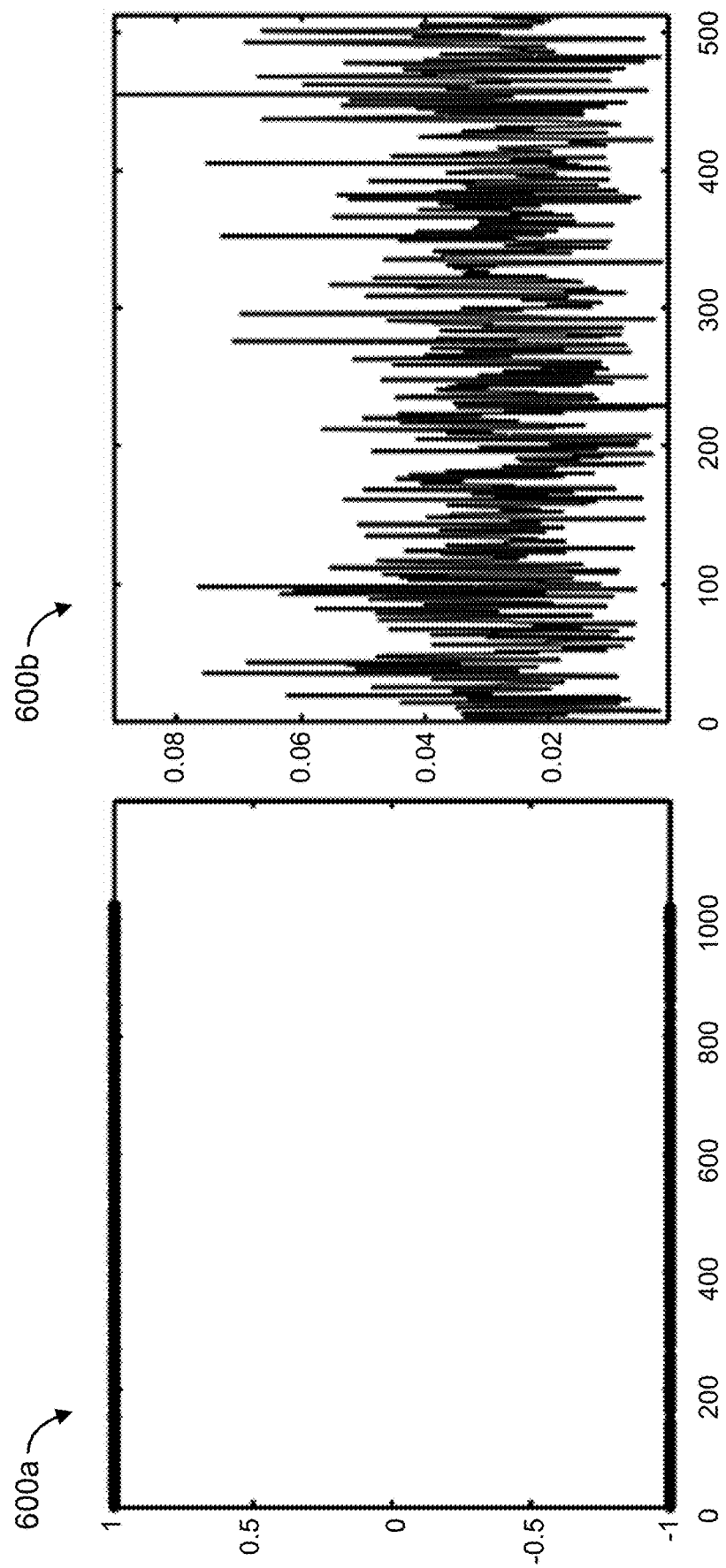
FIGS. 6A and 6B shows illustrative plots of a pseudo-random gain modulation and a resulting spatial spectrum, respectively.

FIGS. 6A and 6B shows illustrative plots 600 of a pseudo-random gain modulation and a resulting spatial spectrum, respectively. The plots 600 generally follow the example described above with reference to FIG. 5. FIG. 6A is a plot 600a of gain error modulation versus row scan time (scan index) generated from experimental data. As illustrated by FIG. 6A, over a sample of 1024 scan cycles, there is a generally random toggling between +1 and −1 in the gain error modulation. This corresponds to a generally random toggling between swap states 510 for the PGAs 220 in FIG. 5. The example relates to a unity gain setting for the PGAs 220 implemented with a randomized toggling between a PGA gain of C1/C2 and a PGA gain of C2/C1. The result is that the vertical FPN becomes randomly spread over a spatial frequency. FIG. 6B is a plot 600b of magnitude versus frequency of the spatial spectrum for the 1024 scan cycles illustrated by FIG. 6A. The plot shows that the original 1× magnitude of FPN has been attenuated, so that a peak value of the spatial spectrum is at approximately 0.09× magnitude. The peak tone attenuation factor can be shown to mathematically correlate to number of scan lines (NL), as approximately 1/sqrt(NL). For example, a further increase in NL can yield a further decrease in peak magnitude for the spatial spectrum.

To further illustrate the effect, C1/C2 is assumed to have a mismatch of 0.3 percent, and the pixel signal level is assumed to hold constant at 10,000 electrons. Without randomization, the column FPN is approximately 30 electrons, or 0.3× of the shot noise root mean squared (RMS) level of 100 electrons. With the randomizing modulation described herein, assuming the data provided in FIGS. 6A and 6B (e.g., 1024 horizontal lines and a resulting attenuation to 0.9× magnitude), the FPN is attenuated to approximately 0.3*0.09=0.027 of the shot noise. As noted above with reference to FIGS. 3A-3D, the original (non-randomized) value of 0.3× is likely to be visible and may be considered insufficient for a high quality image. In contrast, the randomized value of 0.027× is well below acceptable levels of FPN and is likely not visible in, and sufficient for, high quality images. It is noted that the mitigated spatial noise will tend to increase the overall equivalent noise to approximately sqrt(1+0.3*0.3)=1.044×. Thus, in this example, the modulation randomization can produce a 4.4-percent increase in overall equivalent noise, which is very small, particularly in comparison to the performance improvement associated with the modulation randomization.

The above examples assume a unity gain case. In some embodiments, implementing a non-unity gain involves using one or more capacitors in parallel for each capacitor network. For example, if all capacitor networks use matched capacitors, non-unity gain can be achieved by using a different number of the matched capacitors in the input and feedback paths, such that the equivalent C1 is different from the equivalent C2. As one example, a 2× gain can be achieved by configuring the input capacitor network for each PGA 220 to include two matched input capacitors (C11 and C12) in parallel, and by configuring the feedback capacitor network to include a single matched capacitor, such that the gain is approximately (2*C2)/C2. For example, the embodiments illustrated in FIG. 5 can be adapted to include an additional matched capacitor (Cm) at the input of the operational amplifier 210 of each PGA 220, so that the switching would toggle between two gain states: (C1+Cm)/C2, and (C2+Cm)/C1. Non-unity gain can be implemented in any other suitable manner, including as described with reference to FIG. 7.

Figure 7:
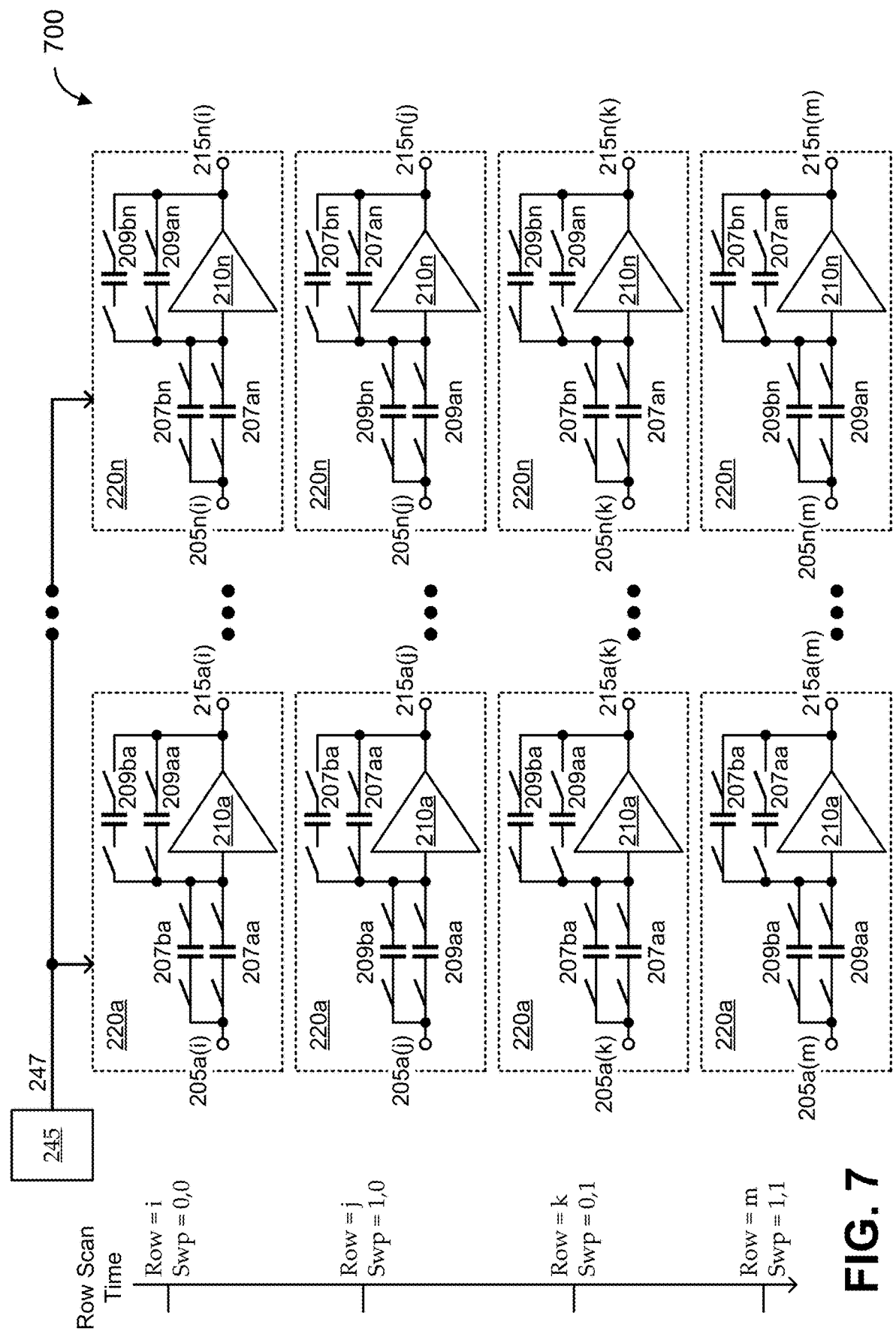
FIG. 7 shows a simplified circuit diagram including multiple PGAs (each of a respective column-parallel ADC) having non-unity gain and coupled with a global randomizer 245, according to various embodiments.

FIG. 7 shows a simplified circuit diagram 700 including multiple PGAs 220 (each of a respective column-parallel ADC 125) having non-unity gain and coupled with a global randomizer 245, according to various embodiments. The circuit diagram 700 shows N PGAs 220, represented by nominally identical PGA 220a through PGA 220n. As described above, each PGA 220 is part of a respective column-parallel ADC 125, such that each PGA 220 is associated with a respective column of pixels of a CIS. During a row scan routine, each row of pixels of the CIS is sequentially shifted to the column-parallel ADCs 125 for readout. FIG. 7 illustrates four illustrative readouts of such a row scan routine, each illustrating a respective one of four swap states. Each PGA 220 can be an implementation of the PGA 220 described with reference to FIG. 2. As illustrated, each PGA 220 includes an operational amplifier 210 coupled with a first capacitor network 207 having two matched capacitors in parallel (207a and 207b, having capacitance of C11 and C12, respectively), and a second capacitor network 209 having two matched capacitors in parallel (209a and 209b, having capacitance of C21 and C22, respectively).

As illustrated, each capacitor in each capacitor network includes a switch at its input and at its output. The switches can be used to selectively add or remove capacitors from their respective capacitor network. Providing a switch at both the input and the output sides of the capacitor can improve performance in some implementations, such as by providing improved analog performance. However, any suitable technique can be used for adding or removing capacitors from capacitor networks. For example, including all the capacitors in both capacitor networks (e.g., all the switches are closed), can correspond to a unity gain state whereby the gain of the PGA 220 is (C11+C12)/(C21+C22) (approximately 1 when all the capacitors are matched). However, including only one of the capacitors in the feedback capacitor network (e.g., switching the other feedback capacitor out of the network), a 2× gain is achieved whereby the gain of the PGA 220 is (C11+C12)/C21, or (C11+C12)/C22 (either being approximately 2 when all the capacitors are matched).

In some such embodiments, the global randomizer 245 can be used to implement a multi-dimensional randomization to generate more than two gain error modulation levels. This can be achieved by using the global randomizer 245 to generate one or more swap control signals 247 having a random multi-bit value for each row scan time. For example, the swap control signal 247 is a sequence of binary values, each binary value indicated by a plurality of bits; at least a first bit of each binary value indicates which of the first or second capacitor network to couple with the operational amplifier as the input capacitor network, and which of the first or second capacitor network to couple with the operational amplifier as the feedback capacitor network; and at least a second bit of each binary value indicates a feedback capacitor configuration, as described below. In the illustrated embodiment, the swap control signal 247 indicates a two-bit value. In some implementations, the two-bit swap control signal 247 is implemented by generating two single-bit swap control signals 247. In other implementations, the global randomizer 245 outputs two bits at a time to generate the two-bit swap control signal 247. A first bit can indicate whether to swap the capacitor networks, and a second bit can indicate which of the capacitors to use in the feedback capacitor network.

In general, embodiments of the operational amplifier 210 are configured (e.g., by configuring the operation amplifier 210 itself, or its respective PGA 220, its respective column-parallel ADC 125 etc.) to select a feedback capacitor configuration in accordance with the swap control signal 247 in each row scan time. For example, the swap state indicates one of multiple feedback capacitor configurations, each activating one of multiple capacitors of the feedback capacitor network and deactivating others of the multiple capacitors of the feedback capacitor network. In the illustrated implementation, the feedback capacitor configuration effectively indicates whether to use capacitor 209a or capacitor 209b when the second capacitor network is being used as the feedback capacitor network (e.g., as in times i and k), or whether to use capacitor 207a or capacitor 207b when the first capacitor network is being used as the feedback capacitor network (e.g., as in times j and m). For example, responsive to the swap control signal indicating a first swap state (row scan time i), the second capacitor network is coupled with the operational amplifier as the feedback capacitor network, and capacitor 209a is selected for activation according to the feedback capacitor configuration, such that the magnitude of the gain is defined by (C11+C12)/C21. Responsive to the swap control signal indicating the second swap state (row scan time j), the first capacitor network is coupled with the operational amplifier as the feedback capacitor network, and capacitor 207a is selected for activation according to the feedback capacitor configuration, such that the magnitude of the gain is defined by (C21+C22)/C11. Responsive to the swap control signal indicating a third swap state (row scan time k), the second capacitor network is coupled with the operational amplifier as the feedback capacitor network, and capacitor 209b is selected for activation according to the feedback capacitor configuration, such that the magnitude of the gain is defined by (C11+C12)/C22. Responsive to the swap control signal indicating the fourth swap state, the first capacitor network is coupled with the operational amplifier as the feedback capacitor network, and capacitor 207b is selected for activation according to the feedback capacitor configuration, such that the magnitude of the gain is defined by (C21+C22)/C12.

FIG. 7 illustrates the four possible states for such a two-bit swap control signal 247, corresponding to four row scan times of a row scan routine, labeled times i, j, k, and m. As illustrated, a first capacitor network 207 includes capacitors 207a and 207b having capacitance C11 and C12, respectively; and a second capacitor network 209 includes capacitors 209a and 209b having capacitance C21 and C22, respectively. At time i, pixel row(i) is shifted to the column-parallel ADCs 125 for readout, and the swap control signal 247 is indicating a '00' (e.g., "unswapped" with a "first" feedback capacitor selected for use). As such, PGAs 220a-220n receive pixel signals 205a(i)-205n(i) from the pixel of row(i), respectively. The first bit indicating a '0' can cause the PGAs 220 in time i to be configured with capacitor network 207 as the input capacitor network, and capacitor network 209 as the feedback capacitor network. The second bit indicating a '0' can cause the feedback capacitor network (capacitor network 209 in the unswapped configuration) to be configured with its first capacitor (capacitor 209a in this configuration) included and its second capacitor (capacitor 209b in this configuration) excluded. For example, as illustrated, the switches are open on either side of all of capacitors 209ba-209bn (i.e., respective capacitor 209b in each of PGA 220a-PGA 220n). In this configuration, the gain of each PGA 220 is (C11+C12)/C21.

At time j, pixel row(j) is shifted to the column-parallel ADCs 125 for readout, and the swap control signal 247 is indicating a '10' (e.g., "swapped" with the "first" feedback capacitor selected for use). As such, PGAs 220a-220n receive pixel signals 205a(j)-205n(j) from the pixel of row(j), respectively. The first bit indicating a '1' can cause the PGAs 220 in time j to be configured with capacitor network 209 as the input capacitor network, and capacitor network 207 as the feedback capacitor network. As in the case of time i, the second bit indicating a '0' can cause the feedback capacitor network to be configured with its first capacitor active. Unlike in the case of time i, the feedback network in time j is capacitor network 207. As such, the second bit being '0' causes capacitor network 207 (in the swapped configuration) to be configured with its first capacitor (capacitor 207a in this configuration) included and its second capacitor (capacitor 207b in this configuration) excluded. For example, as illustrated, the switches are open on either side of all of capacitors 207ba-207bn (i.e., respective capacitor 207b in each of PGA 220a-PGA 220n). In this configuration, the gain of each PGA 220 is (C21+C22)/C11.

At time k, pixel row(k) is shifted to the column-parallel ADCs 125 for readout, and the swap control signal 247 is indicating a '01' (e.g., "unswapped" with a "second" feedback capacitor selected for use). As such, PGAs 220a-220n receive pixel signals 205a(k)-205n(k) from the pixel of row(k), respectively. The first bit indicating a '0' can cause the PGAs 220 in time k to be configured with capacitor network 207 as the input capacitor network, and capacitor network 209 as the feedback capacitor network, as in time i. The second bit indicating a '1' can cause the feedback capacitor network (capacitor network 209 in the unswapped configuration) to be configured with its second capacitor (capacitor 209b in this configuration) included and its second capacitor (capacitor 209a in this configuration) excluded. For example, as illustrated, the switches are open on either side of all of capacitors 209aa-209an. In this configuration, the gain of each PGA 220 is (C11+C12)/C22.

At time m, pixel row(m) is shifted to the column-parallel ADCs 125 for readout, and the swap control signal 247 is indicating a '11' (e.g., "swapped" with the "second" feedback capacitor selected for use). As such, PGAs 220a-220n receive pixel signals 205a(m)-205n(m) from the pixel of row(m), respectively. The first bit indicating a '1' can cause the PGAs 220 in time m to be configured with capacitor network 209 as the input capacitor network, and capacitor network 207 as the feedback capacitor network, as in time j. As in the case of time k, the second bit indicating a '1' can cause the feedback capacitor network to be configured with its second capacitor active. Unlike in the case of time k, the feedback network in time m is capacitor network 207. As such, the second bit being '1' causes capacitor network 207 (in the swapped configuration) to be configured with its second capacitor (capacitor 207b in this configuration) included and its first capacitor (capacitor 207a in this configuration) excluded. For example, as illustrated, the switches are open on either side of all of capacitors 207aa-207an. In this configuration, the gain of each PGA 220 is (C21+C22)/C12.

The illustrated set of cases can be characterized by four sources of capacitor mismatch: C11 to C21, C12 to C21, C11 to C22, and C12 to C22, yielding respective errors of: Error1=C11/C21−1; Error2=C12/C21−1; Error3=C11/C22−1; and Error4=C12/C22−1. Using such error definitions, it can be seen that the error condition at time i is approximately (Error1+Error2)/2; the error at time j is approximately (−Error1−Error3)/2; the error at time k is approximately (Error3+Error4)/2; and the error at time m is approximately (−Error2−Error4)/2. As the swap control signal 247 randomly changes its two bits (e.g., per row scan time), the gain error modulates between the four error conditions illustrated by times i, j, k, and m. This can provide similar FPN attenuation to the unity gain cases described above.

Figure 8:
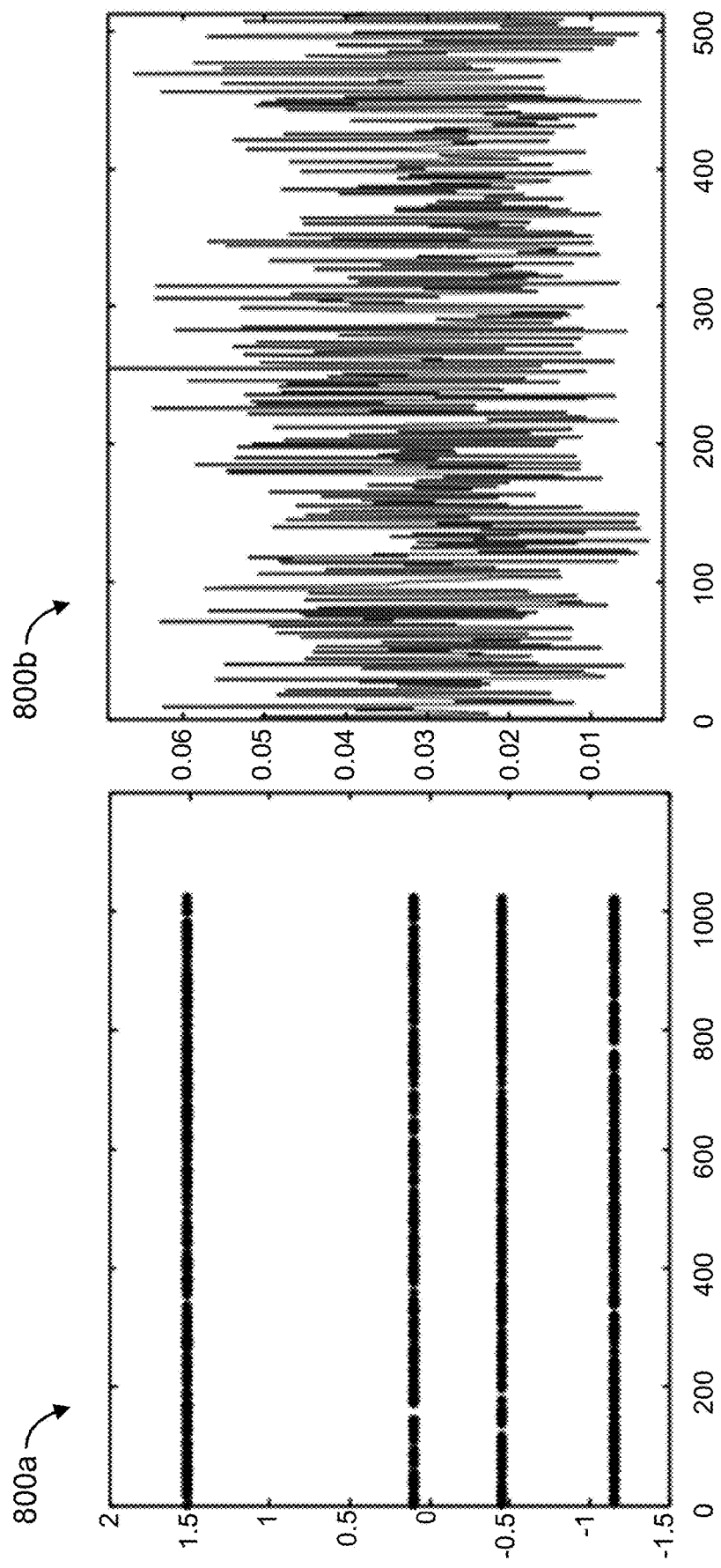
FIGS. 8A and 8B shows illustrative plots of a pseudo-random gain modulation and a resulting spatial spectrum, respectively, for a non-unity gain case.

FIGS. 8A and 8B shows illustrative plots 800 of a pseudo-random gain modulation and a resulting spatial spectrum, respectively, for a non-unity gain case. The plots 800 generally follow the example described above with reference to FIG. 7. FIG. 8A is a plot 800a of gain error modulation versus row scan time (scan index) generated from experimental data. As illustrated by FIG. 8A, over a sample of 1024 scan cycles, there is a generally random toggling between four error conditions corresponding to the four error conditions described above with reference to FIG. 7. In the experimental case, the four error conditions resulted in four error magnitudes of approximately −1.15, −0.45, 0.10, and 1.5 in ratio. This corresponds to a generally random toggling between the four swap states of the non-unity gain condition shown in FIG. 7, according to a particular set of mismatch values. The result is that the vertical FPN becomes randomly spread over a spatial frequency. FIG. 8B is a plot 800b of magnitude versus frequency of the spatial spectrum for the 1024 scan cycles illustrated by FIG. 8A. The plot shows that the original 1× magnitude of FPN has been attenuated, so that a peak value of the spatial spectrum is at approximately 0.07× magnitude. This peak value is similar to the one found in FIG. 6 for the unity gain case.

Figure 9:
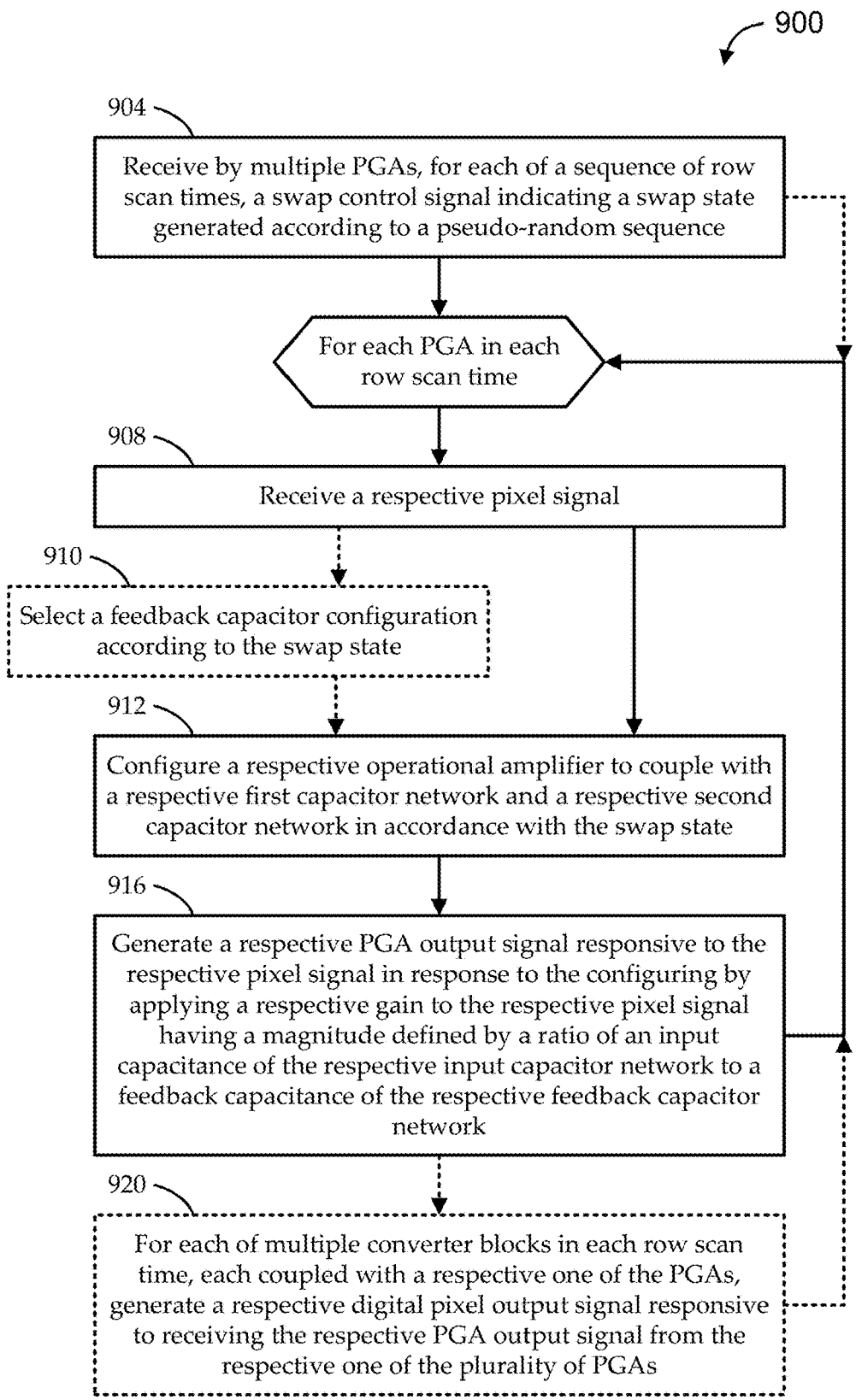
FIG. 9 shows a flow diagram of a method for error-modulated pixel readout by multiple PGAs of a digital image sensor, according to various embodiments.

FIG. 9 shows a flow diagram of a method 900 for error-modulated pixel readout by multiple programmable gain amplifiers (PGAs) of a digital image sensor, according to various embodiments. Embodiments of the method 900 begin at stage 904 by receiving, by the PGAs, for each row scan time of a sequence of row scan times of a row scan routine, a swap control signal indicating a swap state generated according to a pseudo-random sequence. In some implementations, all the PGAs receive a same swap state in each row scan time. In other implementations, the swap control signal includes multiple signals (e.g., from one or more global randomizers), and different groups of PGAs can receive different ones of the multiple signals so as to potentially have different swap states for any particular row scan time. Some embodiments provide a new swap state for each row scan time. Even though a new swap state is received for each row scan time, the swap state may not necessarily change from one row scan time to the next. The swap state is generated according to a pseudo-random sequence, such that there is a probability (depending on the number of possible swap states).

Embodiments of the method 900 continue by performing stages 908-916 (or 908-920) for all PGAs and for each row scan time. For example, each of stages 908-916 can be performed in parallel by all of the PGAs, and the parallel performance of those stages can be repeated iteratively for each of the row scan times. In some embodiments, this parallel and/or iterative performance includes all of stages 904-920. For example, each iteration for each row scan time includes all the PGAs receiving a new swap state in parallel via the swap control signal at stage 904, and proceeds by having all the PGAs perform the remaining stages of the method in parallel for that scan time; subsequently, all the stages (including stage 904) can be repeated in the same manner beginning with receiving a next swap state for the next row scan time.

At stage 908, embodiments can receive a respective pixel signal. As described herein, the pixel signal can correspond to a pixel of an array of pixels of a digital image sensor, such as a CMOS image sensor (CIS). In each row scan time, the digital image sensor can shift a row of pixel signals, in parallel, to column-parallel ADCs coupled with pixel rows of the array. As such, in each row scan time, each PGA can receive the respective pixel as the pixel signal corresponding to its pixel column as shifted to its column-parallel ADC for the row scan time.

At stage 912, embodiments can configure a respective operational amplifier to couple with a respective first capacitor network and a respective second capacitor network in accordance with the swap state. Responsive to the swap control signal indicating a first swap state, the configuring is such that the respective first capacitor network and the respective second capacitor network are coupled with the respective operational amplifier as a respective input capacitor network and as a respective feedback capacitor network, respectively. Responsive to the swap control signal indicating a second swap state, the configuring is such that the respective first capacitor network and the respective second capacitor network are coupled with the respective operational amplifier as the respective feedback capacitor network and as the respective input capacitor network, respectively.

At stage 916, embodiments can generate a respective PGA output signal responsive to the respective pixel signal in response to the configuring by applying a respective gain to the respective pixel signal having a magnitude defined by a ratio of an input capacitance of the respective input capacitor network to a feedback capacitance of the respective feedback capacitor network. In some embodiments, for each respective PGA, C1 is a capacitance of the respective first capacitor network, C2 is a capacitance of the respective second capacitor network, and the first capacitor network is nominally equivalent to the second capacitor network. As used herein, two circuit components being "nominally equivalent," or the like, is intended to indicate that the two circuit components are ideally the same and would be labeled as the same (i.e., would be labeled with the same circuit values); even though any practical implementation would result in the two circuit components being slightly different, for example, due to process variation, or the like. For example, if capacitance C1 is referred to herein as nominally equal to capacitance C2, the implication is that C1 equals C2 plus some small error (e.g., plus or minus some small delta). In some such embodiments, configuring the respective operational amplifier at stage 912 is such that the magnitude of the respective gain applied at stage 916 is characterized by a unity (or non-unity) gain plus a first mismatch error defined by C1/C2 when the swap control signal indicates that the first swap state, and such that the magnitude of the respective gain applied at stage 916 is characterized by a unity (or non-unity) gain plus a second mismatch error defined by C2/C1 when the swap control signal indicates the second swap state.

Some embodiments, at stage 910, can select a feedback capacitor configuration in accordance with the swap state for the row scan time. The feedback capacitor configuration can activate one of multiple capacitors of the respective feedback capacitor network and deactivate others of the multiple capacitors of the respective feedback capacitor network. For example, when the first capacitor network is coupled as the feedback capacitor network, the feedback capacitor configuration can activate a particular one (or multiple) of the capacitors of the first capacitor network for use as feedback capacitors, while deactivating the rest of the capacitors of the first capacitor network (e.g., switching them out of the feedback path); when the second capacitor network is coupled as the feedback capacitor network, the feedback capacitor configuration can activate a particular one (or multiple) of the capacitors of the second capacitor network for use as feedback capacitors, while deactivating the rest of the capacitors of the second capacitor network (e.g., switching them out of the feedback path). In some implementations, the respective first capacitor network has a respective first capacitor of capacitance C11 and a respective second capacitor of capacitance C12, and the respective second capacitor network has a respective third capacitor of capacitance C21 and a respective fourth capacitor of capacitance C22. In such an embodiment, the configuring at stage 912 can be such that: responsive to the swap control signal indicating the first swap state, the respective second capacitor network is coupled with the respective operational amplifier as the respective feedback capacitor network, and the respective third capacitor is selected for activation according to the feedback capacitor configuration, such that the magnitude of the respective gain is defined by (C11+C12)/C21; responsive to the swap control signal indicating the second swap state, the respective first capacitor network is coupled with the respective operational amplifier as the respective feedback capacitor network, and the respective first capacitor is selected for activation according to the feedback capacitor configuration, such that the magnitude of the respective gain is defined by (C21+C22)/C11; responsive to the swap control signal indicating a third swap state, the respective second capacitor network is coupled with the respective operational amplifier as the respective feedback capacitor network, and the respective fourth capacitor is selected for activation according to the feedback capacitor configuration, such that the magnitude of the respective gain is defined by (C11+C12)/C22; and responsive to the swap control signal indicating the fourth swap state, the respective first capacitor network is coupled with the respective operational amplifier as the respective feedback capacitor network, and the respective first capacitor is selected for activation according to the feedback capacitor configuration, such that the magnitude of the respective gain is defined by (C21+C22)/C12. In some such embodiments, the swap control signal is a sequence of binary values, each binary value indicated by multiple bits. For example, at least a first bit of each binary value indicates which of the first or second capacitor network to couple with the operational amplifier as the input capacitor network, and which of the first or second capacitor network to couple with the operational amplifier as the feedback capacitor network; and at least a second bit of each binary value indicates the feedback capacitor configuration.

Some embodiments proceed, at stage 920, by using each of multiple converter blocks in each row scan time (each of the converter blocks coupled with a respective one of the plurality of PGAs) to generate a respective digital pixel output signal responsive to receiving the respective PGA output signal from the respective one of the plurality of PGAs.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third." etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A digital image sensor system comprising:
    a complimentary metal-oxide semiconductor image sensor (CIS) having a plurality of pixels arranged in an array of pixel rows and pixel columns;

a global randomizer configured to output a swap control signal that pseudo-randomly toggles among a plurality of swap states over a plurality of row scan times of a row scan routine of a CMOS image sensor (CIS); and a plurality of column-parallel analog-to-digital converters (ADCs), each column-parallel ADC comprising a respective programmable gain amplifier (PGA) of a plurality of PGAs, each column-parallel ADC coupled with a respective pixel column of the CIS, such that, in each row scan time, a respective pixel row of the CIS is shifted in parallel to the column-parallel ADCs, each respective PGA having:

a pixel signal input configured to receive a respective pixel signal corresponding to the respective pixel column of the PGA and the respective pixel row of the row scan time;

a first capacitor network and a second capacitor network; and an operational amplifier coupled with the global randomizer, and configured to:

generate, for each row scan time, a respective PGA output signal responsive to applying gain to the respective pixel signal for the row scan time according to the swap state indicated by the swap control signal for the row scan time, a magnitude of the gain being a function of a ratio of input capacitance of an input capacitor network to feedback capacitance of a feedback capacitor network, such that, responsive to the swap control signal indicating a first swap state, the operational amplifier is configured to couple with the first capacitor network as the input capacitor network and to couple with the second capacitor network as the feedback capacitor network, and such that, responsive to the swap control signal indicating a second swap state, the operational amplifier is configured to couple with the first capacitor network as the feedback capacitor network and to couple with the second capacitor network as the input capacitor network.

2. The digital image sensor system of claim 1, wherein each column-parallel ADC further comprises:

a respective converter block coupled with the respective PGA of the column-parallel ADC, each respective converter block to generate a respective digital pixel output signal responsive to the respective PGA output signal.

3. The digital image sensor system of claim 1, wherein the global randomizer is configured to output the swap control signal so as to indicate a new swap state for each row scan time in accordance with a pseudo-random sequence.

4. The digital image sensor system of claim 3, wherein:

the global randomizer is configured to output the swap control signal as a same swap control signal to all of the plurality of PGAs, such that each PGA is configured to generate the respective PGA output signal according to a same swap state in each row scan time.

5. The digital image sensor system of claim 1, wherein, for each respective PGA:

the first capacitor network has a first capacitance defined by a first subset of a plurality of nominally matched capacitors; and the second capacitor network has a second capacitance defined by a second subset of the plurality of nominally matched capacitors.

6. The digital image sensor system of claim 5, wherein each of the plurality of nominally matched capacitors comprises a respective capacitor, a respective first switch coupled to an input side of the respective capacitor, and a respective second switch coupled to an output side of the respective capacitor.

7. The digital image sensor system of claim 1, wherein, for each respective PGA, a first capacitance of the first capacitor network is nominally equivalent to a second capacitance of the second capacitor network, such that the magnitude of the gain corresponds to a unity gain plus a first error responsive to the swap control signal indicating the first swap state, and the magnitude of the gain corresponds to the unity gain plus a second error responsive to the swap control signal indicating the second swap state.

8. The digital image sensor system of claim 1, wherein, for each respective PGA, the operational amplifier is further configured, in each row scan time, to:

select a feedback capacitor configuration in accordance with the swap state for the row scan time to thereby activate one of multiple capacitors of the feedback capacitor network and deactivate others of the multiple capacitors of the feedback capacitor network.

9. The digital image sensor system of claim 8, wherein:

the first capacitor network has a first capacitor of capacitance C11 and a second capacitor of capacitance C12;

the second capacitor network has a third capacitor of capacitance C21 and a fourth capacitor of capacitance C22; and the operational amplifier is configured, such that:

responsive to the swap control signal indicating the first swap state, the second capacitor network is coupled with the operational amplifier as the feedback capacitor network, and the third capacitor is selected for activation according to the feedback capacitor configuration, such that the magnitude of the gain is defined by (C11+C12)/C21;

responsive to the swap control signal indicating the second swap state, the first capacitor network is coupled with the operational amplifier as the feedback capacitor network, and the first capacitor is selected for activation according to the feedback capacitor configuration, such that the magnitude of the gain is defined by (C21+C22)/C11;

responsive to the swap control signal indicating a third swap state, the second capacitor network is coupled with the operational amplifier as the feedback capacitor network, and the fourth capacitor is selected for activation according to the feedback capacitor configuration, such that the magnitude of the gain is defined by (C11+C12)/C22; and responsive to the swap control signal indicating the fourth swap state, the first capacitor network is coupled with the operational amplifier as the feedback capacitor network, and the first capacitor is selected for activation according to the feedback capacitor configuration, such that the magnitude of the gain is defined by (C21+C22)/C12.

10. The digital image sensor system of claim 8, wherein:

the swap control signal is a sequence of binary values, each binary value indicated by a plurality of bits;

at least a first bit of each binary value indicates which of the first or second capacitor network to couple with the operational amplifier as the input capacitor network, and which of the first or second capacitor network to couple with the operational amplifier as the feedback capacitor network; and at least a second bit of each binary value indicates the feedback capacitor configuration.

11. A method for error-modulated pixel readout by a plurality of programmable gain amplifiers (PGAs) of a digital image sensor, the method comprising:
receiving, by the plurality of PGAs, for each row scan time of a sequence of row scan times of a row scan routine, a swap control signal indicating a swap state generated according to a pseudo-random sequence; and
for each of the plurality of PGAs, in each row scan time:
receiving a respective pixel signal;
configuring a respective operational amplifier to couple with a respective first capacitor network and a respective second capacitor network in accordance with the swap state, such that:
responsive to the swap control signal indicating a first swap state, the respective first capacitor network and the respective second capacitor network are coupled with the respective operational amplifier as a respective input capacitor network and as a respective feedback capacitor network, respectively; and
responsive to the swap control signal indicating a second swap state, the respective first capacitor network and the respective second capacitor network are coupled with the respective operational amplifier as the respective feedback capacitor network and as the respective input capacitor network, respectively; and
generating a respective PGA output signal responsive to the respective pixel signal in response to the configuring by applying a respective gain to the respective pixel signal having a magnitude defined by a ratio of an input capacitance of the respective input capacitor network to a feedback capacitance of the respective feedback capacitor network.

12. The method of claim 11, further comprising:
for each of a plurality of converter blocks in each row scan time, each of the plurality of converter blocks coupled with a respective one of the plurality of PGAs:
generating a respective digital pixel output signal responsive to receiving the respective PGA output signal from the respective one of the plurality of PGAs.

13. The method of claim 11, wherein:
the receiving the swap control signal comprises receiving a same swap control signal by all of the plurality of PGAs, such that the configuring is performed by all of the PGAs according to a same swap state is in each row scan time.

14. The method of claim 11, wherein, for each respective PGA:
C1 is a capacitance of the respective first capacitor network, C2 is a capacitance of the respective second capacitor network; and
the configuring the respective operational amplifier is such that the magnitude of the respective gain has a first mismatch error corresponding to C1/C2 responsive to the swap control signal indicating the first swap state, and the magnitude of the respective gain has a second mismatch error corresponding to C2/C1 responsive to the swap control signal indicating the second swap state.

15. The method of claim 14, wherein:
the first capacitor network is nominally equivalent to the second capacitor network; and
the configuring the respective operational amplifier is such that the magnitude of the respective gain is a unity gain plus the first mismatch error responsive to the swap control signal indicating the first swap state, and the magnitude of the respective gain is a unity gain plus the second mismatch error responsive to the swap control signal indicating the second swap state.

16. The method of claim 11, further comprising, for each respective PGA in each row scan time:
selecting a feedback capacitor configuration in accordance with the swap state for the row scan time to thereby activate one of multiple capacitors of the respective feedback capacitor network and deactivate others of the multiple capacitors of the respective feedback capacitor network.

17. The method of claim 16, wherein:
the respective first capacitor network has a respective first capacitor of capacitance C11 and a respective second capacitor of capacitance C12;
the respective second capacitor network has a respective third capacitor of capacitance C21 and a respective fourth capacitor of capacitance C22; and
the configuring the respective operational amplifier is such that:
responsive to the swap control signal indicating the first swap state, the respective second capacitor network is coupled with the respective operational amplifier as the respective feedback capacitor network, and the respective third capacitor is selected for activation according to the feedback capacitor configuration, such that the magnitude of the respective gain is defined by (C11+C12)/C21;
responsive to the swap control signal indicating the second swap state, the respective first capacitor network is coupled with the respective operational amplifier as the respective feedback capacitor network, and the respective first capacitor is selected for activation according to the feedback capacitor configuration, such that the magnitude of the respective gain is defined by (C21+C22)/C11;
responsive to the swap control signal indicating a third swap state, the respective second capacitor network is coupled with the respective operational amplifier as the respective feedback capacitor network, and the respective fourth capacitor is selected for activation according to the feedback capacitor configuration, such that the magnitude of the respective gain is defined by (C11+C12)/C22; and
responsive to the swap control signal indicating the fourth swap state, the respective first capacitor network is coupled with the respective operational amplifier as the respective feedback capacitor network, and the respective first capacitor is selected for activation according to the feedback capacitor configuration, such that the magnitude of the respective gain is defined by (C21+C22)/C12.

18. The method of claim 16, wherein:
the swap control signal is a sequence of binary values, each binary value indicated by a plurality of bits;
at least a first bit of each binary value indicates which of the first or second capacitor network to couple with the operational amplifier as the input capacitor network, and which of the first or second capacitor network to couple with the operational amplifier as the feedback capacitor network; and
at least a second bit of each binary value indicates the feedback capacitor configuration.

19. An error-modulatable programmable gain amplifier (PGA) circuit for use with a digital image sensor, the PGA circuit comprising:

a control input configured to receive, for each row scan time of a sequence of row scan times, a swap control signal indicating a swap state generated according to a pseudo-random sequence;

a pixel input configured to receive a pixel signal corresponding to one of a plurality of pixels of a pixel array of the digital image sensor;

a first capacitor network and a second capacitor network; and an operational amplifier configured to generate a PGA output signal by applying gain to the pixel signal in accordance with the swap state received at the control input, a magnitude of the gain defined by a ratio of an input capacitance to a feedback capacitance, such that:

responsive to the swap control signal indicating a first swap state, the first capacitor network is coupled with the operational amplifier to provide the input capacitance, and the second capacitor network is coupled with the operational amplifier to provide the feedback capacitance; and responsive to the swap control signal indicating a second swap state, the first capacitor network is coupled with the operational amplifier to provide the feedback capacitance, and the second capacitor network is coupled with the operational amplifier to provide the input capacitance.

20. The PGA circuit of claim 19, wherein:

the first capacitor network has a capacitance of C1 defined by a first capacitor subset of a plurality of nominally matched capacitors;

the second capacitor network has a capacitance of C2 defined by a second capacitor subset of the plurality of nominally matched capacitors; and the operational amplifier is configured, such that:

responsive to the swap control signal indicating the first swap state, the magnitude of the gain is defined by C1/C2, and a gain error corresponds to a capacitance mismatch from the first capacitor subset to the second capacitor subset; and responsive to the swap control signal indicating the second swap state, the magnitude of the gain is defined by C2/C1, and the gain error corresponds to a capacitance mismatch from the second capacitor subset to the first capacitor subset.

* * * * *